US012635170B2

(12) United States Patent
Halder et al.

(10) Patent No.: US 12,635,170 B2
(45) Date of Patent: May 19, 2026

(54) SHIELDED GATE TRANSISTOR

(71) Applicant: Qorvo US, Inc., Greensboro, NC (US)

(72) Inventors: Subrata Halder, Greensboro, NC (US);
Corey A. Nevers, Hillsboro, OR (US)

(73) Assignee: Qorvo US, Inc., Greensboro, NC (US)

( * ) Notice: Subject to any disclaimer, the term of this
patent is extended or adjusted under 35
U.S.C. 154(b) by 582 days.

(21) Appl. No.: 18/181,109

(22) Filed: Mar. 9, 2023

(65) Prior Publication Data

US 2023/0352572 A1 Nov. 2, 2023

Related U.S. Application Data

(60) Provisional application No. 63/335,932, filed on Apr.
28, 2022.

(51) Int. Cl.
| | |
|---|---|
| *H01L 29/778* | (2006.01) |
| *H10D 30/01* | (2025.01) |
| *H10D 30/47* | (2025.01) |
| *H10D 62/85* | (2025.01) |
| *H10W 44/20* | (2026.01) |

(52) U.S. Cl.
CPC ......... *H10D 30/475* (2025.01); *H10D 30/015*
(2025.01); *H10D 62/8503* (2025.01); *H10W*
*44/20* (2026.01); *H10W 44/248* (2026.01)

(58) Field of Classification Search
None
See application file for complete search history.

(56) References Cited

U.S. PATENT DOCUMENTS

2013/0228788 A1 9/2013 Yamamura
2020/0328146 A1* 10/2020 Kajiwara ............ H01L 23/3192

FOREIGN PATENT DOCUMENTS

WO WO-2017182739 A1 * 10/2017 ........... H10D 64/519

OTHER PUBLICATIONS

Asano, K. et al., "Novel high power AlGaAs/GaAs HFET with a
field-modelling plate operated at 35v drain voltage," Electron
Devices Meeting (IEDM '88) Technical Digest, Jan. 1999, IEEE, 5
pages.

(Continued)

*Primary Examiner* — William C Trapanese
(74) *Attorney, Agent, or Firm* — Withrow & Terranova,
P.L.L.C.

(57) ABSTRACT
A transistor is disclosed having a substrate, a device layer
disposed over the substrate, a gate electrode disposed over
the device layer, and a drain electrode disposed over the
substrate and spaced from the gate electrode. A first source
electrode is disposed over the substrate opposite the drain
electrode and spaced from the gate electrode. A second
source electrode is disposed over the substrate spaced from
the drain electrode opposite the gate electrode. A dielectric
is disposed over the device layer, the gate electrode, and the
drain electrode between the first source electrode and the
second source electrode. A conductive interconnect couples
the first source electrode and the second electrode and
extends over the dielectric. The conductive interconnect
comprises a shield wall that extends from the conductive
interconnect into the dielectric between the gate electrode
and the drain electrode with a distal end that is spaced above
the device layer.

30 Claims, 9 Drawing Sheets

(56) References Cited

OTHER PUBLICATIONS

Karmalkar, S. et al., "Very high voltage AlGaN/GaN high electron mobility transistors using a field plate deposited on a stepped insulator," Solid-State Electronics, vol. 45, Issue 9, Sep. 2001, Elsevier, 8 pages.

Liu, W., "Fundamentals of III-V Devices: HBTs, MESFETs, and HFETs/HEMTs," John Wiley & Sons, Inc., Apr. 1999, pp. 436-443.

Rajabi, S. et al., "A novel double field-plate power high electron mobility transistor based on AlGaN/GaN for performance improvement," 2011 International Conference on Signal Processing, Communication, Computing and Networking Technologies, Jul. 21-22, 2011, Thuckalay, India, IEEE, 5 pages.

Soni, A. et al., "Novel Drain-Connected Field Plate GaN HEMT Designs for Improved VBD—RON Tradeoff and RF PA Performance," IEEE Transactions on Electron Devices, vol. 67, Issue 4, Apr. 2020, first published Mar. 2020, IEEE, 8 pages.

Kie, G. et al., "Breakdown Voltage Enhancement for Power AlGaN/GaN HEMTswith Air-bridge Field Plate," 2011 IEEE International Conference of Electron Devices and Solid-State Circuits, Nov. 17-18, 2011, Tianjin, China, IEEE, 2 pages.

Extended European Search Report for European Patent Application No. 23167575.2, mailed Sep. 21, 2023, 10 pages.

* cited by examiner

| DIMENSION (MICRONS) | A | B | C | D | E | F | G |
|---|---|---|---|---|---|---|---|
| 1ST EMBODIMENTS | 0.2 – 0.5 | 0.2 – 0.5 | 0.1 – 0.5 | 0.4 – 0.5 | 0.1 – 0.5 | 0.1 – 0.5 | 0.3 – 0.5 |
| 2ND EMBODIMENTS | 0.5 – 2 | 0.5 – 2 | 0.5 – 1.4 | 0.5 – 2 | 0.5 – 0.6 | 0.5 – 1 | 0.5 – 1.5 |
| 3RD EMBODIMENTS | 2 – 6 | 2 – 5 | 1.4 – 4 | 2 – 6 | 0.6 – 3 | 1 – 1.5 | 1.5 – 5 |
| 4TH EMBODIMENTS | 6 – 10 | 5 – 10 | 4 – 8 | 6 – 10 | 3 – 5 | 1.5 – 2 | 5 – 8 |

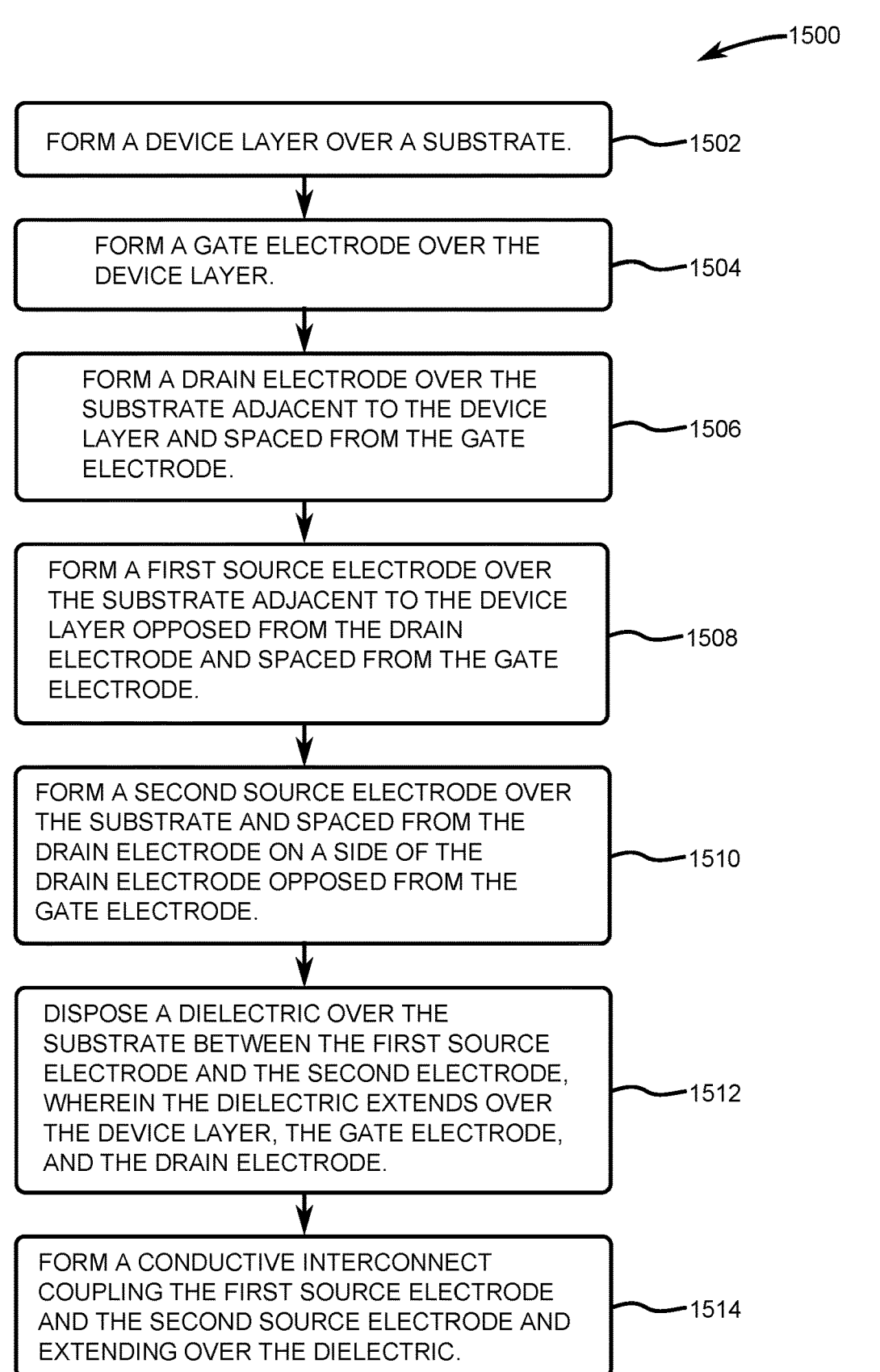

1500

FORM A DEVICE LAYER OVER A SUBSTRATE. — 1502

FORM A GATE ELECTRODE OVER THE DEVICE LAYER. — 1504

FORM A DRAIN ELECTRODE OVER THE SUBSTRATE ADJACENT TO THE DEVICE LAYER AND SPACED FROM THE GATE ELECTRODE. — 1506

FORM A FIRST SOURCE ELECTRODE OVER THE SUBSTRATE ADJACENT TO THE DEVICE LAYER OPPOSED FROM THE DRAIN ELECTRODE AND SPACED FROM THE GATE ELECTRODE. — 1508

FORM A SECOND SOURCE ELECTRODE OVER THE SUBSTRATE AND SPACED FROM THE DRAIN ELECTRODE ON A SIDE OF THE DRAIN ELECTRODE OPPOSED FROM THE GATE ELECTRODE. — 1510

DISPOSE A DIELECTRIC OVER THE SUBSTRATE BETWEEN THE FIRST SOURCE ELECTRODE AND THE SECOND ELECTRODE, WHEREIN THE DIELECTRIC EXTENDS OVER THE DEVICE LAYER, THE GATE ELECTRODE, AND THE DRAIN ELECTRODE. — 1512

FORM A CONDUCTIVE INTERCONNECT COUPLING THE FIRST SOURCE ELECTRODE AND THE SECOND SOURCE ELECTRODE AND EXTENDING OVER THE DIELECTRIC. — 1514

FIG. 15

SHIELDED GATE TRANSISTOR

RELATED APPLICATIONS

This application claims the benefit of provisional patent application Ser. No. 63/335,932, filed Apr. 28, 2022, the disclosure of which is hereby incorporated herein by reference in its entirety.

FIELD OF THE DISCLOSURE

The present disclosure relates to transistors used in radio frequency/microwave circuits in wireless communications and radar systems.

BACKGROUND

Pseudomorphic high electron mobility transistors (pHEMT) fabricated from III-V materials such as aluminum gallium arsenide and indium gallium arsenide are employed in high-gain microwave and millimeter wave amplifiers due to two-dimensional electron gas with high electron mobility. However, maximum gain for pHEMTs is at least partially determined and limited by parasitic impedances resulting from parasitic capacitances, inductances, and resistances. Therefore, a need remains for reducing the maximum gain limit due to parasitic impedances.

SUMMARY

A transistor is disclosed having a substrate, a device layer disposed over the substrate, a gate electrode disposed over the device layer, and a drain electrode disposed over the substrate and spaced from the gate electrode. A first source electrode is disposed over the substrate opposed from the drain electrode and spaced from the gate electrode. A second source electrode is disposed over the substrate and is spaced from the drain electrode opposite the gate electrode. A dielectric is disposed over the device layer, the gate electrode, and the drain electrode between the first source electrode and the second electrode. A conductive interconnect couples the first source electrode and the second source electrode and extends over the dielectric, wherein the conductive interconnect comprises a shield wall that extends from the conductive interconnect into the dielectric between the gate electrode and the drain electrode with a distal end that is spaced above the device layer.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 15 is a flow diagram depicting method steps for fabricating the disclosed transistor.

DETAILED DESCRIPTION

Figures 1, 2:
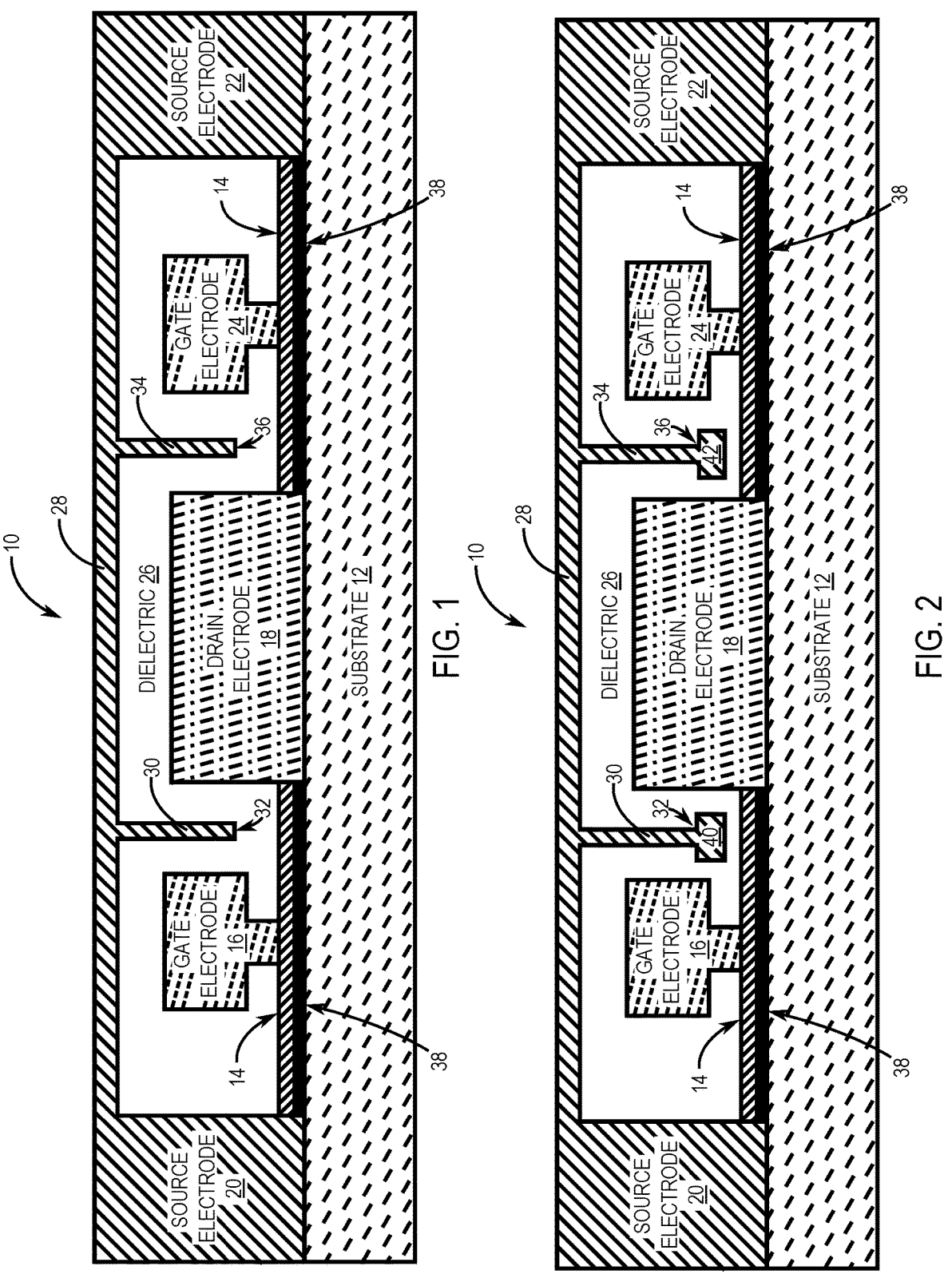
FIG. 1 is a structural diagram of a first embodiment of a shielded gate transistor with shield walls.
FIG. 2 is a structural diagram of a second embodiment of a shielded gate transistor having shield walls and via stops.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a structural diagram of a first embodiment of a transistor 10 having a substrate 12, a device layer 14 disposed over the substrate 12, and a first gate electrode 16 disposed over the device layer 14. A drain electrode 18 is disposed over the substrate 12 and is spaced from the first gate electrode 16. A first source electrode 20 is disposed over the substrate 12 opposed from the drain electrode 18. The first source electrode 20 is spaced from the first gate electrode 16 and is adjacent to the device layer 14. A second source electrode 22 is disposed over the substrate 12 and is spaced from drain electrode 18 and is located adjacent to the device layer 14 opposite of the first gate electrode 16. A second gate electrode 24 is disposed between the drain electrode 18 and the second source electrode 22. The second gate electrode 24 is laterally spaced from both the drain electrode 18 and the second source electrode 22. A dielectric 26 is disposed over the device layer 14, the first gate electrode 16, the drain electrode 18, and the second gate electrode 24 that are located between the first source electrode 20 and the second electrode 22. The dielectric 26 may be, but is not limited to, benzocyclobutene (BCB), silicon dioxide, air, and near vacuum.

A conductive interconnect 28 extends over the dielectric 26 and electrically couples the first source electrode 20 to the second source electrode 22. The conductive interconnect 28 comprises a first shield wall 30 that extends from the conductive interconnect 28 into the dielectric 26 at a location spaced between the first gate electrode 16 and the drain electrode 18 with a distal end 32 that is spaced above the device layer 14. The conductive interconnect 28 further comprises a second shield wall 34 that extends from the conductive interconnect 28 into the dielectric 26 at a location spaced between the second gate electrode 24 and the drain electrode 18 with a distal end 36 that is spaced above the device layer 14. The first shield wall 30 is configured to intercept an electric field that would form between the first gate electrode 16 and the drain electrode 18 if the first shield wall 30 did not exist. Similarly, the second shield wall 34 is configured to intercept an electric field that would form between the second gate electrode 24 and the drain electrode 18 if the second shield wall 34 did not exist. A two-dimensional electron gas 38 forms between the first source electrode 20, the second source electrode 22, and the drain electrode 18. For this embodiment and remaining embodiments, it is to be understood that the depiction of the transistor 10 is shown in cross-section and the depicted elements in three-dimensional space would extend into and out of the page onto which the depiction is presented.

FIG. 2 is a structural diagram of another embodiment of the transistor 10. In this embodiment, the first shield wall 30 further includes a first via stop 40 that extends from the distal end 32 of the first shield wall 30. The first via stop 40 has a thickness that is greater than the thickness of the first shield wall 30. The first via stop 40 is configured to further shield the first gate electrode 16 and the drain electrode 18 from the electric field that would normally exist between the first gate electrode 16 and the drain electrode 18. Similarly, the second shield wall 34 further includes a second via stop 42 that extends from the distal end 36 of the second shield wall 34. The second via stop 40 has a thickness that is greater than the thickness of the second shield wall 34. The second via stop 42 is configured to further shield the second gate electrode 24 and the drain electrode 18 from the electric field that would normally exist between the second gate electrode 24 and the drain electrode 18.

Figures 3, 4:
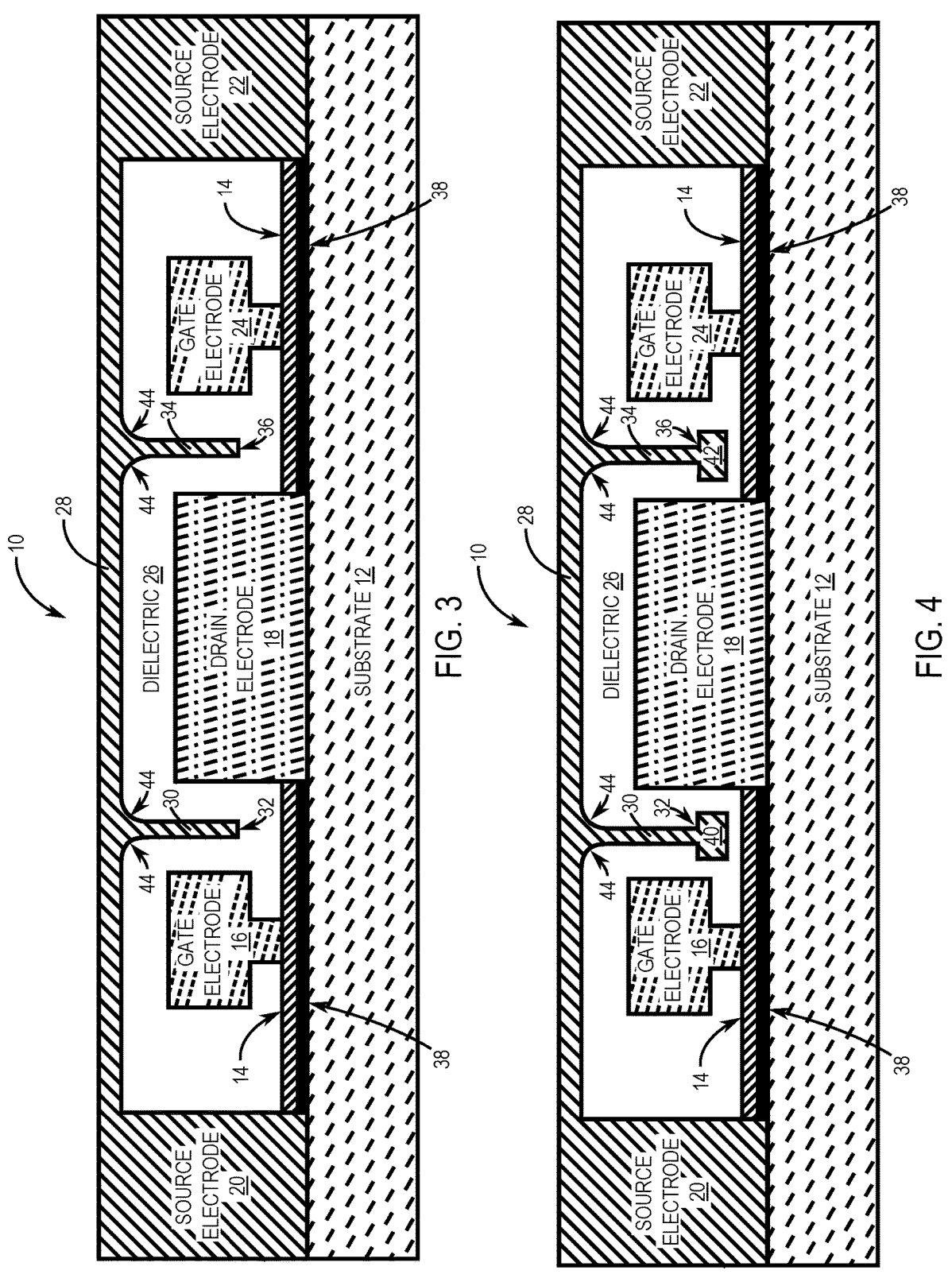
FIG. 3 is a structural diagram of a first embodiment of a shielded gate transistor with filleted shield walls.
FIG. 4 is a structural diagram of a second embodiment of a shielded gate transistor having filleted shield walls and via stops.

FIG. 3 depicts a structural diagram of a further embodiment of the transistor 10. In this further embodiment, the first shield wall 30 and the second shield wall 34 each include fillets 44 that transition the first shield wall 30 and the second shield wall 34 into the conductive interconnect 28. FIG. 4 depicts a structural diagram of yet another embodiment of the transistor 10. In this yet another embodiment, the first shield wall 30 and the second shield wall 34 each also include the fillets 44 that transition the first shield wall 30 and the second shield wall 34 into the conductive interconnect 28. In both the embodiments of FIG. 3 and FIG. 4, the fillets 44 are configured with radiuses of curvature that reduce sharp corners that might cause regions of undesirable increases in electric field strength.

Figures 5, 6, 7:
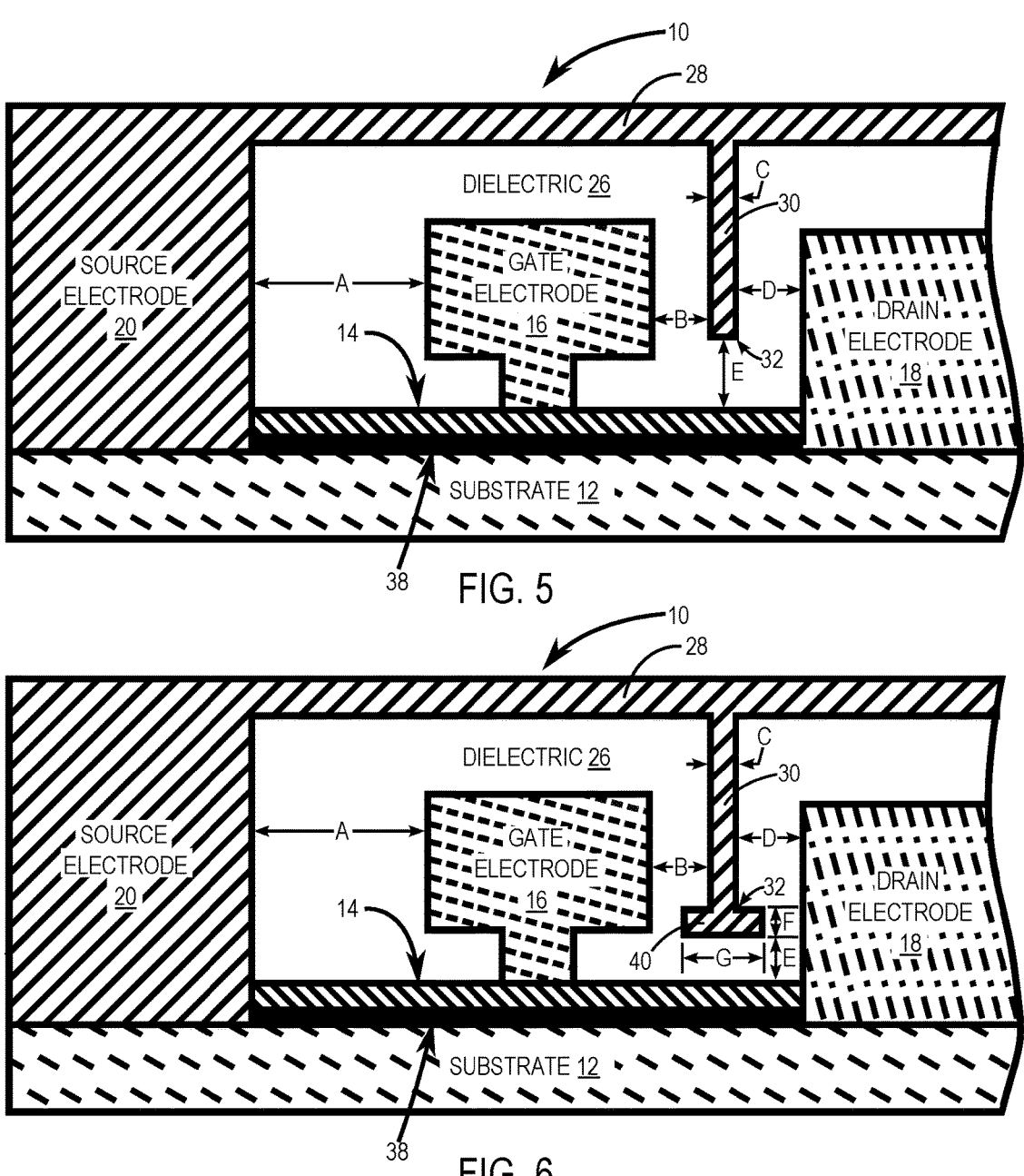
FIG. 5 is a partial structural diagram of the first embodiment of the shielded gate transistor showing dimension labels.
FIG. 6 is a partial structural diagram of the second embodiment of the shielded gate transistor showing dimension labels.
FIG. 7 is a table of dimensions for the dimensions labeled in FIG. 5 and FIG. 6.

FIG. 5 is a partial structural diagram of the first embodiment of the transistor 10 (FIG. 1) showing dimension labels. In general, a dimension A, which is a shortest distance between the first gate electrode 16 and the first source electrode 20 may be between 0.2 micron and 10 microns. In first embodiments, the dimension A may be between 0.2 micron and 0.5 micron. In second embodiments, the dimension A may be between 0.5 micron and 2 microns. In third embodiments, the dimension A may be between 2 microns and 6 microns. In fourth embodiments, the dimension A may be between 6 microns and 10 microns.

In general, a dimension B, which is a distance between the first gate electrode 16 and the first shield wall 30 may be between 0.2 micron and 8 microns. In first embodiments, the dimension B may be between 0.2 micron and 0.5 micron. In second embodiments, the dimension B may be between 0.5 micron and 2 microns. In third embodiments, the dimension B may be between 2 microns and 5 microns. In fourth embodiments, the dimension B may be between 5 microns and 10 microns.

In general, a dimension C, which is a thickness of the first shield wall 30, may be between 0.1 micron and 8 microns. In first embodiments, the dimension C may be between 0.1 micron and 0.5 micron. In second embodiments, the dimension C may be between 0.5 micron and 1.4 microns. In third embodiments, the dimension C may be between 1.4 microns and 4 microns. In fourth embodiments, the dimension C may be between 4 microns and 8 microns.

In general, a dimension D, which is a distance between the drain electrode 18 and the first shield wall 30 may be between 0.4 micron and microns. In first embodiments, the dimension D may be between 0.4 micron and 0.5 micron. In second embodiments, the dimension D may be between 0.5 micron and 2 microns. In third embodiments, the dimension D may be between 2 micron and 6 microns. In fourth embodiments, the dimension D may be between 6 microns and 10 microns.

A dimension E as depicted in FIG. 5 is a distance between the distal end 32 of the first shield wall 30 and a top surface of the device layer 14. In general, the dimension E may be between 0.1 micron and 5 microns. In first embodiments, the dimension E is between 0.1 micron and 0.5 micron. In second embodiments, the dimension E is between 0.5 micron and 0.6 micron. In third embodiments, the dimension E is between 0.6 micron and 3 microns. In fourth embodiments, the dimension E is between 3 microns and 5 microns. It is to be understood that while the dimensions A through E are depicted for a first portion of the transistor 10 that includes the first source electrode 20, the first gate electrode 16, and the drain electrode 18, the same dimensions of A through E are available by symmetry for a second portion of the transistor 10 that includes the second source electrode 22, the second gate electrode 24, and the second shield wall 34 (FIGS. 1 and 3).

FIG. 6 is a partial structural diagram of the second embodiment of the transistor 10 (FIG. 2) showing dimension labels. In FIG. 6, the dimension E is the distance between the top surface of the device layer 14 and a bottom surface of the first via stop 40. In this case, the dimension E is generally between 0.1 micron and 5 microns. In first embodiments, the dimension E is between 0.1 micron and 0.5 micron. In second embodiments, the dimension E is between 0.5 micron and 0.6 micron. In third embodiments, the dimension E is between 0.6 micron and 3 microns. In fourth embodiments, the dimension E is between 3 microns and 5 microns. A dimension F is a height of the first via stop 40, and the dimension F is generally between 0.1 micron and 2 microns. In first embodiments, the dimension F is between 0.1 micron and 0.5 micron. In second embodiments, the dimension F is between 0.5 micron and 1 micron. In third embodiments, the dimension F is between 1 micron and 1.5 micron. In fourth embodiments, the dimension F is between 1.5 microns and 2 microns. A dimension G is the thickness of the first via stop 40 and is generally between 0.3 micron and 8 microns. In first embodiments, the dimension G is between 0.3 micron and 0.5 micron. In second embodiments, the dimension G is between 0.5 and 1.5 microns. In third embodiments, the dimension G is between 1.5 microns and 5 microns. In fourth embodiments, the dimension G is between microns and 8 microns.

It should also be understood that the fillets 44 depicted in FIG. 3 and FIG. 4 do not necessarily change the dimensions A through G. Therefore, all the dimensions depicted in FIG. 5 and FIG. 6 are also available for the embodiments of the transistor 10 depicted in FIG. 3 and FIG. 4. FIG. 7 provides a summary for the dimensions A through G that are depicted in FIG. 5 and FIG. 6.

Figure 8:
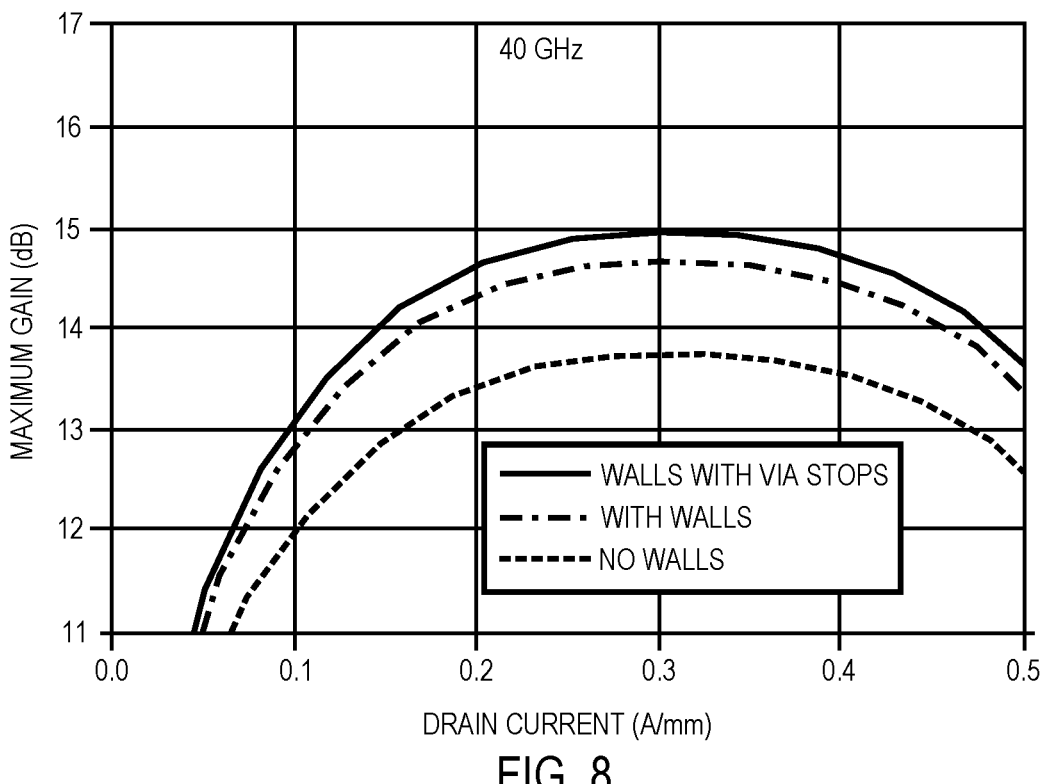
FIG. 8 is a graph of maximum gain versus drain current for the shielded transistor operated at 40 GHz.
Figure 9:
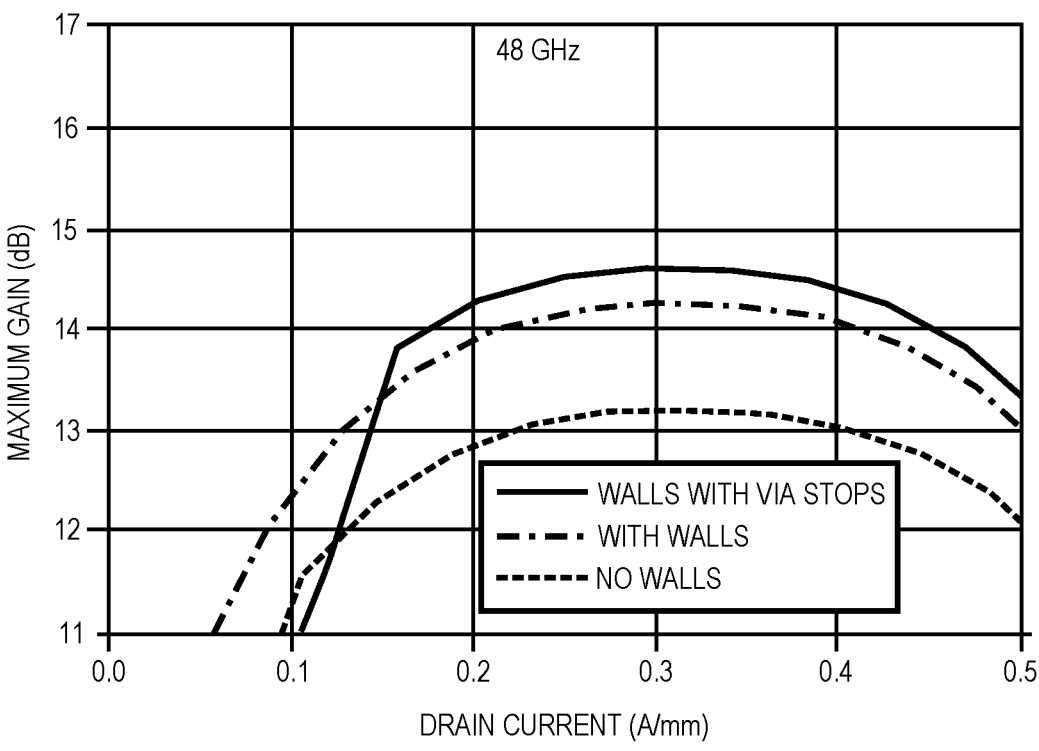
FIG. 9 is a graph of maximum gain versus drain current for the shielded transistor operated at 48 GHz.
Figure 10:
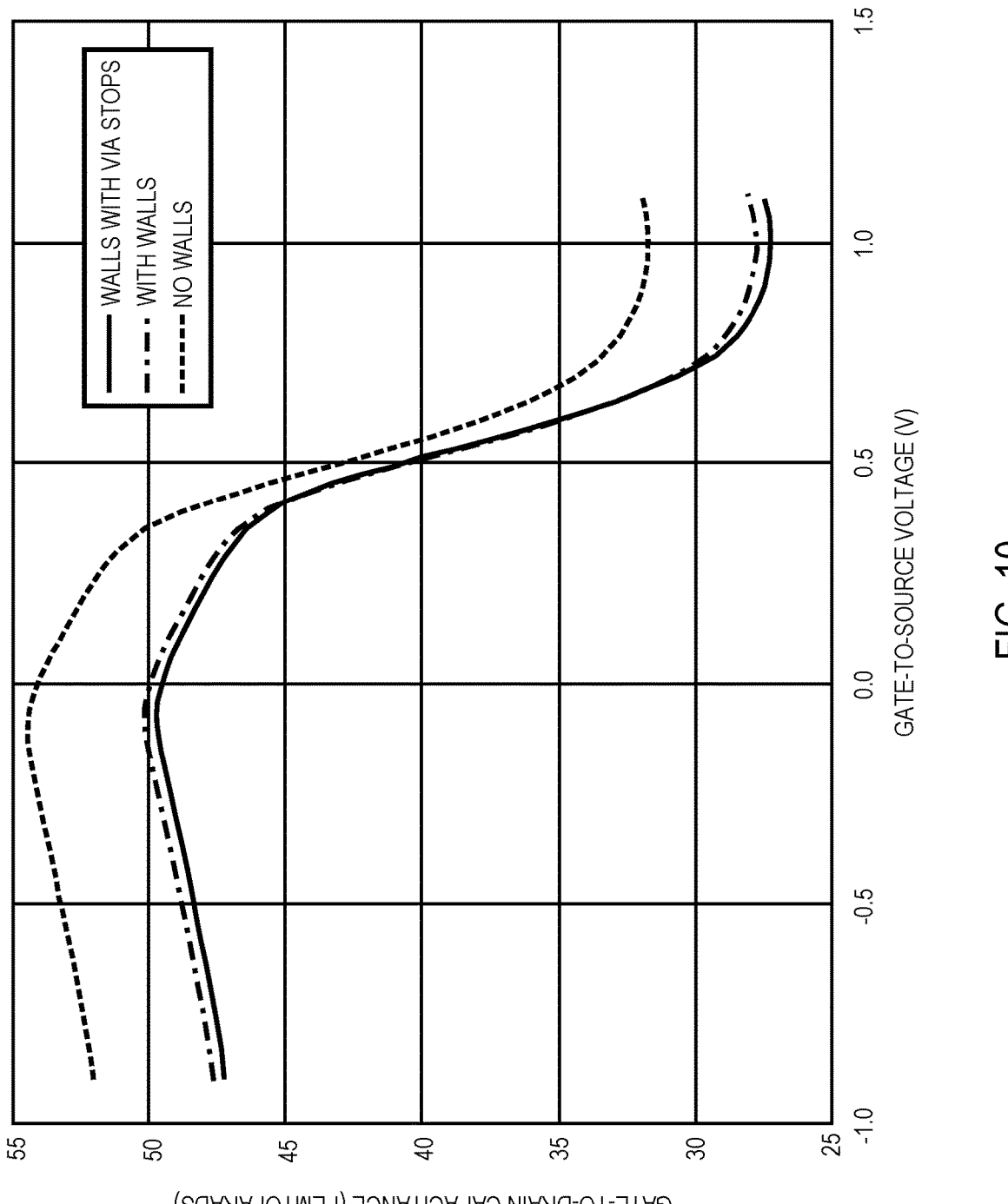
FIG. 10 is a graph of gate-to-drain capacitance versus gate-to-source voltage.

Measurements presented in graphs depicted in FIGS. 8, 9, and 10 were taken from embodiments of transistor 10 configured as an enhancement-mode pseudomorphic high electron mobility transistor. FIG. 8 is a graph of maximum gain versus drain current for the transistor 10 operated at 40 GHz. Notice that there is a maximum gain of 15 dB for the second embodiment of FIG. 2 versus a maximum gain of around 13.7 dB for a similarly structured transistor without shield walls.

FIG. 9 is a graph of maximum gain versus drain current for the transistor 10 operated at 48 GHz. Notice that there is a maximum gain of 14.5 dB for the second embodiment of FIG. 2 versus a maximum gain of around 13.2 dB for a similarly structured transistor without shield walls.

FIG. 10 is a graph of gate-to-drain capacitance versus gate-to-source voltage. The measurement of gate-to-drain capacitance was taken at a measurement frequency of 5 GHz. Notice that there is about a 5 femtofarad less capacitance at zero source voltage than for a similarly structured transistor without shield walls.

Figures 11, 12:
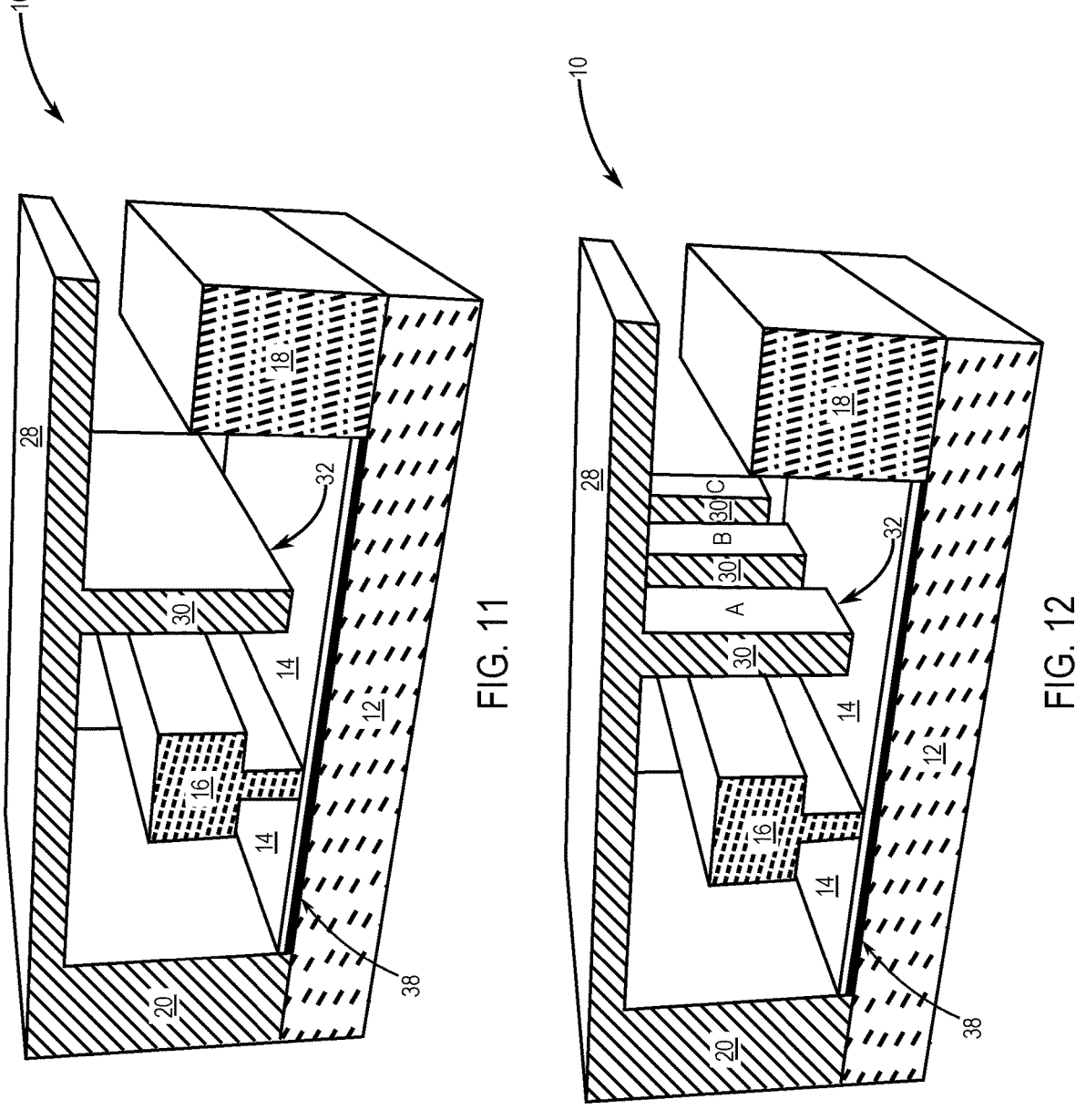
FIG. 11 is a partial structural diagram showing a three-dimensional depiction of the first embodiment of the shielded gate transistor illustrated in FIG. 1 and FIG. 5.
FIG. 12 is a partial structural diagram showing a three-dimensional depiction of another embodiment of the shielded gate transistor in which the shield wall is longitudinally segmented.

FIG. 11 is a partial structural diagram showing a three-dimensional depiction of the first embodiment of the shielded gate transistor 10 illustrated in FIG. 1 and FIG. 5. As shown in FIG. 11, the shield wall 30 extends longitudinally between the gate electrode 16 and the drain electrode 18. It is to be understood that this embodiment may be modified to include fillets 44 to become the second embodiment depicted in FIG. 3. In this FIG. 11 and the following FIGS. 12-14, the dielectric 26 depicted in FIGS. 1-6 is not depicted but is not limited to benzocyclobutene (BCB), silicon dioxide, air, and near vacuum.

FIG. 12 is a partial structural diagram showing a three-dimensional depiction of another embodiment of the shielded gate transistor 10 in which the shield wall 30 is longitudinally segmented having spaces at regular or irregular intervals. In this exemplary embodiment there are three segments labeled A, B, and C, respectively. However, other numbers of segments may be realized. Each segment may have fillets 44 as depicted in FIG. 3.

Figures 13, 14:
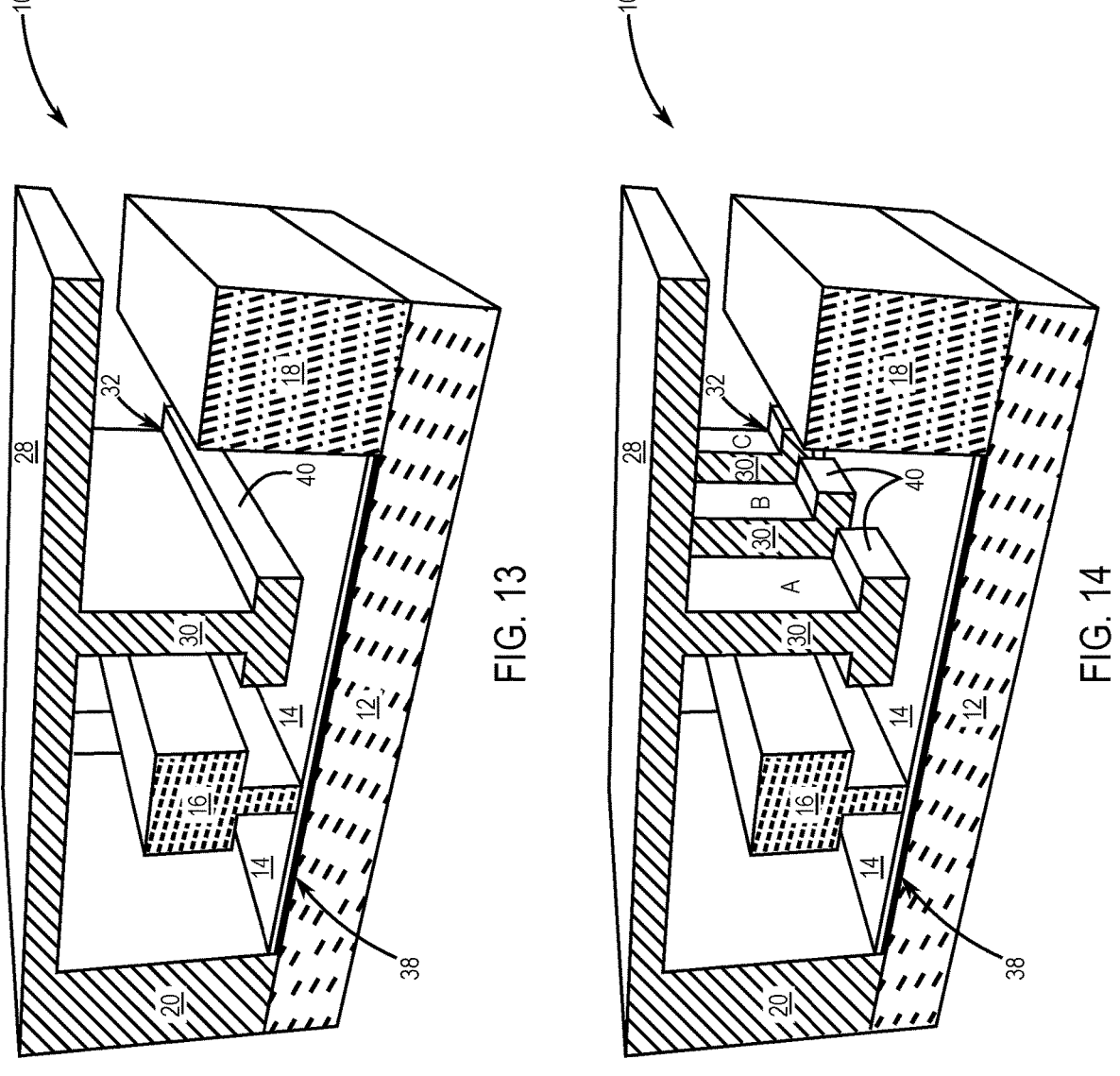
FIG. 13 is a partial structural diagram showing a three-dimensional depiction of the first embodiment of the shielded gate transistor illustrated in FIG. 1 and FIG. 5.
FIG. 14 is a partial structural diagram showing a three-dimensional depiction of yet another embodiment of the shielded gate transistor in which the shield wall with via stops is longitudinally segmented.

FIG. 13 is a partial structural diagram showing a three-dimensional depiction of the second embodiment of the shielded gate transistor 10 illustrated in FIG. 2 and FIG. 6. As shown in FIG. 13, the shield wall 30 with the first via stop 40 extends longitudinally between the gate electrode 16 and the drain electrode 18. It is to be understood that this embodiment may be modified to include fillets 44 to become the embodiment depicted in FIG. 3.

FIG. 14 is a partial structural diagram showing a three-dimensional depiction of yet another embodiment of the shielded gate transistor 10 in which the shield wall 30 is longitudinally segmented having spaces at regular or irregular intervals. In this exemplary embodiment, each segment is terminated by a first via stop 40. Moreover, in this exemplary embodiment there are three segments labeled A, B, and C, respectively. However, other numbers of segments may be realized. Each segment may have fillets 44 as depicted in FIG. 4.

In general, the disclosed embodiments are realizable as high frequency field-effect transistors (FETs) having source, gate, and drain structures. Therefore, any metal-semiconductor field-effect transistor may be constructed to realize the disclosed embodiments. Examples include gallium nitride-based devices independent of the substrate 12 (FIGS. 1-6 and 11-14), which includes, but is not limited to, materials such as silicon and silicon carbide. Moreover, various radio frequency (RF) silicon processes may be employed to fabricate the disclosed embodiments independent of the substrate 12, such as silicon and silicon-on-insulator (SOI). Example devices realizing the disclosed embodiments may be, but are not limited to, RF SOI devices, RF complementary metal oxide semiconductor devices, and strained silicon metal oxide semiconductor FETs such as silicon germanium devices. Further still, other III/V semiconductor devices may be realized. One example set of such devices includes, but is not limited to, the indium aluminum arsenide and indium gallium arsenide family of devices on gallium arsenide substrates. Example devices included in this technology are metamorphic high electron mobility (mHEMT) devices. Moreover, indium phosphide and indium gallium arsenide families of devices on indium phosphide substrates may also be used in fabrication of the disclosed embodiments. Example devices included in this technology are pseudomorphic high electron mobility (pHEMT) devices.

FIG. 15 is a flow diagram depicting a method 1500 for fabricating the transistor 10. Method 1500 may begin with forming a device layer over a substrate (step 1502). A gate electrode may then be formed over the device layer (step 1504). A drain electrode may be formed over the substrate adjacent to the device layer and spaced from the gate electrode (step 1506). A first source electrode may be formed over the substrate adjacent to the device layer opposed from the drain electrode and spaced from the gate electrode (step 1508). A second source electrode may be formed over the substrate and spaced from the drain electrode on a side of the drain electrode opposed from the gate electrode (step 1510). It is to be understood that the formation of the electrodes may take place in various orders and may be formed practically simultaneously.

After electrode fabrication from the previous steps, a dielectric may be disposed over the substrate between the first source electrode and second electrode, wherein the dielectric extends over the device layer, the gate electrode, and the drain electrode (step 1512). Next, a conductive interconnect coupling the first source electrode and the second source extending over the dielectric is formed (step 1514). The conductive interconnect comprises a shield wall that extends from the conductive interconnect into the dielectric between the gate electrode and the drain electrode with a distal end that is spaced above the device layer.

Figure 16:
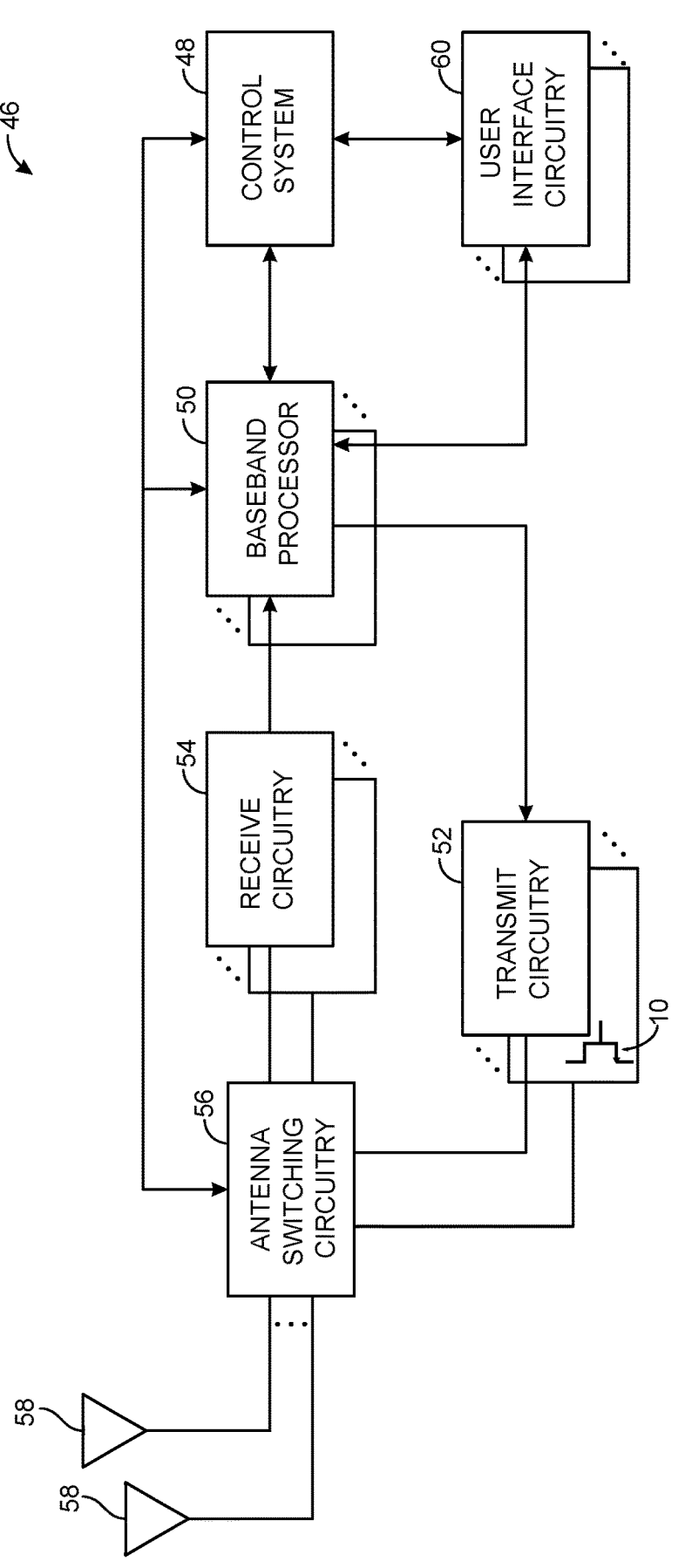
FIG. 16 is a diagram showing how the disclosed transistors may be employed within user elements such as wireless communication devices.

With reference to FIG. 16, the concepts described above may be implemented in various types of wireless communication devices or user elements 46, such as mobile terminals, smart watches, tablets, computers, navigation devices, access points, and the like that support wireless communications, such as cellular, wireless local area network (WLAN), Bluetooth, and near-field communications. Moreover, some communication systems do not employ basestations. For example, very small aperture terminals (VSAT) and point-to-point systems that operate at millimeter wave frequencies will also benefit from the embodiments of the present disclosure.

In an exemplary embodiment, the user elements 46 will generally include a control system 48, a baseband processor 50, transmit circuitry 52 made up the transistors 10 having structures depicted in FIGS. 1-6 and FIGS. 11-14, receive circuitry 54, antenna switching circuitry 56, multiple antennas 58, and user interface circuitry 60. The receive circuitry 54 receives radio frequency signals via the antennas 58 and through the antenna switching circuitry 56 from one or more basestations. A low-noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams.

The baseband processor 50 processes the digitized received signal to extract the information or data bits conveyed in the received signal. This processing typically comprises demodulation, decoding, and error correction operations. The baseband processor 50 is generally implemented in one or more digital signal processors and application-specific integrated circuits.

For transmission, the baseband processor 50 receives digitized data, which may represent voice, data, or control information, from the control system 48, which it encodes for transmission. The encoded data is output to the transmit circuitry 52, where it is used by a modulator to modulate a carrier signal that is at a desired transmit frequency or frequencies. A power amplifier will amplify the modulated carrier signal to a level appropriate for transmission and deliver the modulated carrier signal through the antenna switching circuitry 56 to the antennas 58. The antennas 58 and the replicated transmit circuitry 52 and receive circuitry 54 may provide spatial diversity. Modulation and processing details will be understood by those skilled in the art.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A transistor comprising:
a substrate;
a device layer disposed over the substrate;
a first gate electrode disposed over the device layer;
a drain electrode disposed over the substrate adjacent to the device layer and spaced from the first gate electrode;
a first source electrode disposed over the substrate adjacent to the device layer opposed from the drain electrode and spaced from the gate electrode;
a second source electrode disposed over the substrate and spaced from drain electrode on a side of the drain electrode opposed from the gate electrode;
a dielectric disposed over the substrate between the first source electrode and the second electrode, wherein the dielectric extends over the device layer, the gate electrode, and the drain electrode; and
a conductive interconnect coupling the first source electrode and the second source electrode and extending over the dielectric, wherein the conductive interconnect comprises a first shield wall that extends from the conductive interconnect into the dielectric between the first gate electrode and the drain electrode with a distal end that is spaced above the device layer, wherein the first shield wall is configured to intercept an electric field that would form between the first gate electrode and the drain electrode if the first shield wall did not exist.

2. The transistor of claim 1 further comprising a second gate electrode disposed over the device layer opposed to both the first gate electrode and the drain electrode, wherein the conductive interconnect further comprises a second shield wall that extends from the conductive interconnect into the dielectric between the second gate electrode and the drain electrode with a distal end that is spaced above the device layer.

3. The transistor of claim 2 wherein the first shield wall comprises a first via stop at the distal end of the first shield wall and the second shield wall comprises a second via stop at the distal end of the second shield wall.

4. The transistor of claim 3 wherein a thickness of the first via stop is greater than a thickness of the first shield wall and a thickness of the second via stop is greater than a thickness of the second shield wall.

5. The transistor of claim 3 wherein a shortest distance between the first gate electrode and the first source electrode is between 0.2 micron and 10 microns.

6. The transistor of claim 3 wherein a distance between the first gate electrode and the first shield wall is between 0.2 micron and 8 microns.

7. The transistor of claim 3 wherein a thickness of the first shield wall is between 0.1 micron and 8 microns.

8. The transistor of claim 3 wherein a distance between the drain electrode and the first shield wall is between 0.4 micron and 10 microns.

9. The transistor of claim 3 wherein a distance between the distal end of the first shield wall and a top surface of the device layer is between 0.1 micron and 5 microns.

10. The transistor of claim 3 wherein a height of the first via stop 40 is between 0.1 micron and 2 microns.

11. The transistor of claim 3 further comprising fillets between the first shield wall and the conductive interconnect and fillets between the second shield wall and the conductive interconnect.

12. The transistor of claim 3 wherein the first shield wall and the second shield wall are each longitudinally segmented.

13. A method for fabricating a transistor on a substrate, the method comprising:
forming a device layer over the substrate;
forming a first gate electrode over the device layer;
forming a drain electrode over the substrate adjacent to the device layer and spaced from the gate electrode;
forming a first source electrode over the substrate adjacent to the device layer opposed from the drain electrode and spaced from the gate electrode;
forming a second source electrode over the substrate and spaced from the drain electrode on a side of the drain electrode opposed from the gate electrode;
disposing a dielectric over the substrate between the first source electrode and the second electrode, wherein the dielectric extends over the device layer, the gate electrode, and the drain electrode;
forming a conductive interconnect coupling the first source electrode and the second source electrode and extending over the dielectric, wherein the conductive interconnect comprises a first shield wall that extends from the conductive interconnect into the dielectric between the first gate electrode and the drain electrode with a distal end that is spaced above the device layer, wherein the first shield wall is configured to intercept an electric field that would form between the first gate electrode and the drain electrode if the first shield wall did not exist.

14. The method for fabricating the transistor on the substrate of claim 13 further comprising:
disposing a second gate electrode over the device layer opposed to both the first gate electrode and the drain electrode; and
forming a second shield wall that extends from the conductive interconnect into the dielectric between the second gate electrode and the drain electrode with a distal end that is spaced above the device layer.

15. The method for fabricating the transistor on the substrate of claim 14 further comprising fabricating a first via stop at the distal end of the first shield wall and fabricating a second via stop at the distal end of the second shield wall.

16. The method for fabricating the transistor on the substrate of claim 15 wherein a thickness of the first via stop is greater than a thickness of the first shield wall and a thickness of the second via stop is greater than a thickness of the second shield wall.

17. The method for fabricating the transistor on the substrate of claim 13 wherein a shortest distance between the first gate electrode and the first source electrode is between 0.2 micron and 10 microns.

18. The method for fabricating the transistor on the substrate of claim 13 wherein a distance between the first gate electrode and the first shield wall is between 0.2 micron and 8 microns.

19. The method for fabricating the transistor on the substrate of claim 13 wherein a thickness of the first shield wall is between 0.1 micron and 8 microns.

20. The method for fabricating the transistor on the substrate of claim 13 wherein a distance between the drain electrode and the first shield wall is between 0.4 micron and 10 microns.

21. The method for fabricating the transistor on the substrate of claim 13 wherein a distance between the distal end of the first shield wall and a top surface of the device layer is between 0.1 micron and 5 microns.

22. The method for fabricating the transistor on the substrate of claim 13 wherein a height of the first via stop 40 is between 0.1 micron and 2 microns.

23. The method for fabricating the transistor on the substrate of claim 14 further comprising fillets between the first shield wall and the conductive interconnect and fillets between the second shield wall and the conductive interconnect.

24. The method for fabricating the transistor on the substrate of claim 14 wherein the first shield wall and the second shield wall are each longitudinally segmented.

25. A wireless communication device comprising:

a baseband processor;

transmit circuitry configured to receive encoded data from the baseband processor and to modulate a carrier signal with the encoded data, wherein the transmit circuitry comprises:

a substrate;

a device layer disposed over the substrate;

a first gate electrode disposed over the device layer;

a drain electrode disposed over the substrate adjacent to the device layer and spaced from the first gate electrode;

a first source electrode disposed over the substrate adjacent to the device layer opposed from the drain electrode and spaced from the gate electrode;

a second source electrode disposed over the substrate and spaced from drain electrode on a side of the drain electrode opposed from the gate electrode;

a dielectric disposed over the substrate between the first source electrode and the second electrode, wherein the dielectric extends over the device layer, the gate electrode, and the drain electrode; and a conductive interconnect coupling the first source electrode and the second source electrode and extending over the dielectric, wherein the conductive interconnect comprises a first shield wall that extends from the conductive interconnect into the dielectric between the gate electrode and the drain electrode with a distal end that is spaced above the device layer, wherein the first shield wall is configured to intercept an electric field that would form between the first gate electrode and the drain electrode if the first shield wall did not exist.

26. The wireless communication device of claim 25 further comprising a second gate electrode disposed over the device layer opposed to both the first gate electrode and the drain electrode, wherein the conductive interconnect further comprises a second shield wall that extends from the conductive interconnect into the dielectric between the second gate electrode and the drain electrode with a distal end that is spaced above the device layer.

27. The wireless communication device of claim 26 wherein the first shield wall comprises a first via stop at the distal end of the first shield wall and the second shield wall comprises a second via stop at the distal end of the second shield wall.

28. The wireless communication device of claim 27 wherein a thickness of the first via stop is greater than a thickness of the first shield wall and a thickness of the second via stop is greater than a thickness of the second shield wall.

29. The wireless communication device of claim 27 further comprising fillets between the first shield wall and the conductive interconnect and fillets between the second shield wall and the conductive interconnect.

30. The wireless communication device of claim 26 wherein the first shield wall and the second shield wall are each longitudinally segmented.

* * * * *